(12) United States Patent
Debaty

(10) Patent No.: US 6,611,173 B2
(45) Date of Patent: Aug. 26, 2003

(54) MILLER EFFECT-BASED CIRCUIT FOR SPLITTING POLES

(75) Inventor: Pascal Debaty, Domene (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/102,402

(22) Filed: Mar. 19, 2002

(65) Prior Publication Data

US 2002/0171494 A1 Nov. 21, 2002

(30) Foreign Application Priority Data

Mar. 19, 2001 (FR) .............................. 01 03684

(51) Int. Cl.⁷ .............................................. H03F 1/14
(52) U.S. Cl. ...................... 330/292; 330/294; 330/107; 330/109
(58) Field of Search .................. 330/107, 109, 330/292, 294

(56) References Cited

U.S. PATENT DOCUMENTS

| | | | |
|---|---|---|---|
| 3,983,504 A | * | 9/1976 | Moy .......................... 330/107 |
| 5,204,639 A | | 4/1993 | Moore et al. ................ 330/294 |
| 5,635,871 A | | 6/1997 | Cavigelli ..................... 330/107 |

FOREIGN PATENT DOCUMENTS

JP 406164246 * 6/1994

OTHER PUBLICATIONS

Yang et al. "An Equivalent Circuit Model for Two–Stage Operational Amplifiers," IEEE International Symposium on Circuits and Systems Jun. 7–9, 1988, pp 635–638 vol. 1.*

* cited by examiner

Primary Examiner—Michael B Shingleton
(74) Attorney, Agent, or Firm—Lisa K. Jorgenson; Robert Iannucci; Seed IP Law Group PLLC

(57) ABSTRACT

A circuit for splitting poles between a first stage and a second inverting voltage-amplifier stage of an electronic circuit, comprises, in series between the output of the first stage and the output of the second stage, and in that order, a first capacitor, a second capacitor and a resistor. The circuit further comprises a voltage-divider bridge which is connected between a terminal delivering a substantially constant voltage and the output of the first stage. The output of the voltage-divider bridge is linked to the common node between the first capacitor and the second capacitor, in such a way that a first resistor of the voltage-divider bridge is connected in parallel with the first capacitor.

19 Claims, 1 Drawing Sheet

MILLER EFFECT-BASED CIRCUIT FOR SPLITTING POLES

BACKGROUND OF THE INVENTION

1. Field of the Invention

The present invention relates to a circuit for splitting poles between a first stage and a second stage of an electronic circuit, relying on the Miller effect.

It relates to the field of circuit design for components or electronic circuits, especially monolithic integrated circuits, in CMOS or other technology. It finds applications, in particular, in amplifier circuits.

2. Description of the Related Art

Figure 1:
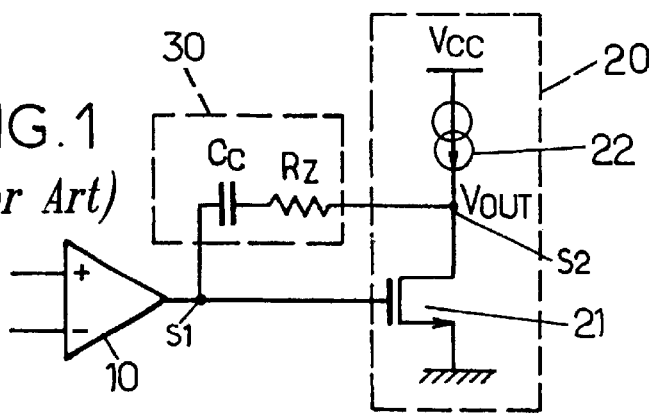

FIG. 1 is the diagram of an electronic circuit, for example an amplifier, comprising a first stage 10, a second stage 20 and a pole-splitting circuit 30 according to the prior art. The first stage behaves like a transconductance which delivers or draws a current through its output impedance. The second stage 20 is an inverting voltage amplifier. The output signal from this stage is therefore in phase opposition (180°) with respect to the signal at the input.

In this example, the second stage 20 is arranged in series with, and downstream of, the first stage 10. The pole-splitting circuit 30 is arranged between the output S1 of the first stage 10 and the output S2 of the second stage 20. It consists of the branch between the nodes S1 and S2 which comprises, in series, a capacitor Cc and a resistor Rz of relatively high value. This branch forms a feedback loop from the output S2 onto the output S1. The capacitance of this branch, which here corresponds to the capacitor Cc, is called loop capacitance. In this example, moreover, the first stage 10 is an operational amplifier and the second stage 20 is a power-output stage The latter consists of a power MOS transistor 21 in common-source mode, in series with a current source 22 between a power supply terminal delivering a positive power supply voltage Vcc, on the one hand, and the ground on the other hand. The transistor 21 here is an N-type MOS transistor, the output S2 of the stage 20 being taken on the drain of this transistor and the current source 22 being arranged between Vcc and this drain. Such a stage is therefore an inverting voltage amplifier.

The pole-splitting circuit 30 provides feedback and has the function of separating the respective poles of the first and of the second stage, so as to facilitate control of the stability of the feedback-type amplifier. More precisely, it makes it possible to shift, towards the low frequencies, the dominant pole p1 at the output S1 of the first stage 10. This is because, if the load resistance and the load capacitance at the output of the first stage 10 and at the output of the second stage 20 respectively are denoted Rout1 and Cout1 and Rout2 and Cout2 respectively, then:

the dominant pole p1 at the output S1 of the first stage 10 is given by:

$$p1 = \frac{-1}{Rout1 \times Cc \times Av2} \quad (1)$$

a second pole p2 is given by:

$$p2 = \frac{-1}{Rout1 \times \frac{Cout2}{Av2}} \quad (2)$$

a third pole p3 is given by:

$$p3 = \frac{1}{Rz \times Cout2} \quad (3)$$

and a zero z1 is given by:

$$z1 = \frac{1}{\left(\frac{1}{gm2} - Rz\right) \times Cc} \quad (4)$$

wherein, further, Av2 is the voltage gain of the second stage 20 and gm2 is the transconductance of the transistor 21 of the second stage 20.

According to the principle known as the Miller effect, the loop capacitance Cc is multiplied by the gain Av2 in expression (1) above. Stated otherwise, the capacitance Cc, which intervenes in the expression of the dominant pole p1 at the output S1 of the first stage, is seen, on this node, as being multiplied by the value Av2 of the gain of the second stage 20. This amounts to shifting the pole p1 towards the low frequencies.

In certain applications, the loop capacitance Cc has to withstand high potential differences. Thus, in the example represented in FIG. 1, in which the value of the signal Vout at the output S2 of the second stage 10 can vary between 0 V (volts) and Vcc, the voltage at the terminals of Cc can reach a maximum of Vcc-Vt, where Vt is the threshold voltage of a MOS transistor (typically 0.7 V). It results therefrom that the voltage at the terminals of Cc can exceed 10 V as soon as Vcc is higher than 10 V. However, the maximum value of the voltage which a capacitor, produced according to HF7CMOS technology, for example, can withstand is substantially equal to 10 V.

The pole-splitting circuit according to the prior art is therefore not suitable for this type of application.

Consequently, a circuit structure for splitting poles which is suitable in applications where the voltage at the terminals of the capacitor Cc can exceed the maximum voltage imposed by the technology used for fabrication would be desirable.

BRIEF SUMMARY OF THE INVENTION

Aspects of the invention include a circuit for splitting poles between a first stage and a second inverting voltage-amplifier stage of an electronic circuit. The circuit comprises, on the one hand, in series between the output of the first stage and the output of the second stage, and in that order, a first capacitor, a second capacitor and a resistor, and, on the other hand, a voltage-divider bridge. The voltage-divider bridge is connected between a terminal delivering a substantially constant voltage and the output of the first stage. The output of the voltage-divider bridge is linked to the common node between the first capacitor and the second capacitor, in such a way that a first resistor of the voltage-divider bridge is connected in parallel with the first capacitor.

The fact of replacing the single loop capacitor Cc of FIG. 1 with two capacitors in series, and of imposing a defined potential at the common point between these capacitors by virtue of the voltage-divider bridge, makes it possible to reduce the maximum voltage which might be applied on each of these capacitors. The connection of the above voltage-divider bridge does not affect the feedback, even at low frequencies, whereby the Miller effect is maintained.

Another aspect of the invention relates to an electronic circuit comprising a first stage and a second stage the respective outputs of which are linked by a circuit for splitting poles as defined above.

BRIEF DESCRIPTION OF THE OF THE SEVERAL VIEWS OF THE DRAWINGS

Figure 2:
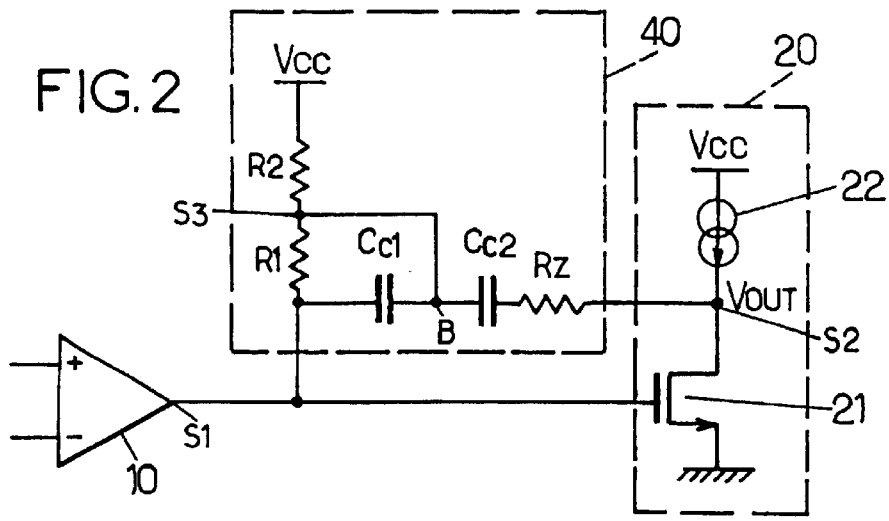
Figure 3:
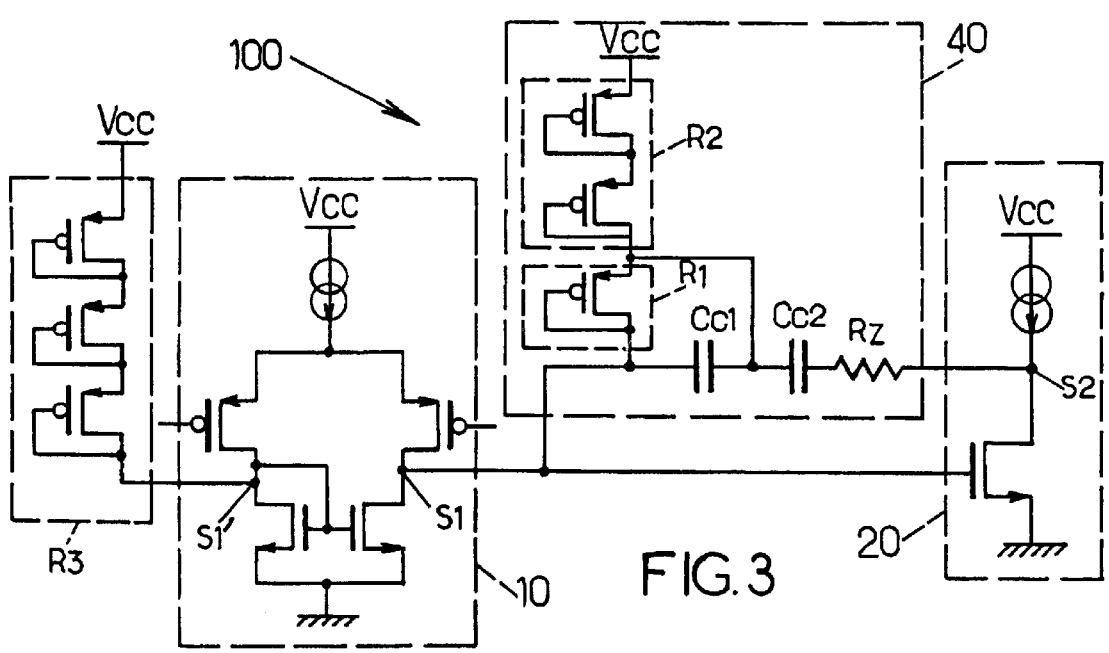

FIG. 1, already analyzed, is the diagram of a pole-splitting circuit according to the prior art;

FIG. 2 is the diagram of a pole-splitting circuit according to an embodiment of the invention; and FIG. 3 is the diagram of an example electronic circuit comprising a pole-splitting circuit according to FIG. 2.

DETAILED DESCRIPTION OF THE INVENTION

FIG. 2, in which the same elements as in FIG. 1 bear the same references, depicts a pole-splitting circuit 40 according to an embodiment of the present invention.

Circuit 40 comprises, in series between the output S1 of the first stage 10 and the output S2 of the second stage 20, and in that order, a capacitor Cc1, a capacitor Cc2 and a resistor Rz. The second stage 20 is an inverting voltage-amplifier. The first stage 10 may be of any type. In the example represented, the first stage 10 is also an amplifier.

Circuit 40 further comprises a voltage-divider bridge. The latter is connected between a terminal delivering a substantially constant voltage (for example the positive power-supply terminal, delivering a positive power-supply voltage Vcc), and the output S1 of the first stage 10. It comprises, in series between S1 and Vcc, and in that order, a resistor R1 and a resistor R2. The output S3 of the voltage-divider bridge, i.e. the node which is common between resistors R1 and R2, is linked to the node B which is common between capacitors Cc1 and Cc2. Stated otherwise, the resistor R1 and the capacitor Cc1 are mounted in parallel between the output S1 of stage 10 and the node B.

In order to describe the functioning of the circuit 40, it is appropriate to distinguish the functioning at low frequencies on the one hand and the functioning at high frequencies on the other hand.

At low frequencies, the impedance of the capacitor Cc1 is very much greater than that of the resistor R1 of the divider bridge. Everything therefore happens as if the capacitor were replaced by an open circuit. Consequently, the loop capacitance is determined by the capacitor Cc2 alone. Nevertheless, by reason of the presence of the divider bridge, the current absorbed or restored by the capacitor Cc2 which, respectively, originates from or is delivered to the output S1 of the first stage 10, is less, by a ratio R2/(R1+R2) than that respectively absorbed or restored under the same conditions by the loop capacitance Cc of the circuit 30 of FIG. 1. This is why, in order for the pole p1 to keep the same value as that obtained with the circuit of the prior art represented in FIG. 1 (which value is given by the relationship (1) above), it is appropriate to choose the values of R1, R2 and Cc2 in such a way that:

$$Cc2 = \frac{R1 + R2}{R2} \times Cc \quad (5)$$

At high frequencies, the impedance of the capacitor Cc1 is very much less than that of the resistor R1. The voltage-divider bridge R1, R2 is therefore short-circuited by the capacitor Cc1. Consequently, the loop capacitance is determined by the capacitors Cc1 and Cc2 in series. This is why, in order for the pole p1 to keep the value obtained with the circuit 30 of FIG. 1, it is appropriate to choose the values of Cc1 and Cc2 in such a way that:

$$\frac{1}{Cc1} + \frac{1}{Cc2} = \frac{1}{Cc} \quad (6)$$

that is to say in such a way that:

$$\frac{Cc1 \times Cc2}{Cc1 + Cc2} = Cc \quad (7)$$

It results from the foregoing that the structure of the circuit 40 makes it possible to obtain the separating of the poles relying on the Miller effect. It will be noted that this would not be the case if the voltage-divider bridge R1, R2 were connected between the power-supply terminal Vcc and the ground, instead of being connected between the power-supply terminal Vcc and the output S1 of the first stage 10. In this case, at low frequencies, the current respectively absorbed or restored by the capacitor Cc2 would originate from the power-supply terminal Vcc or would be discharged to ground instead, respectively, of originating from, or of being delivered to the output S1 of the first stage 10.

By combining relationships (5) and (7) above, there is obtained:

$$R2 \times (Cc1 + Cc2) = (R1 + R2) \times Cc1 \quad (8)$$

Expression (8) above is simplified when, as is conventional, a proportionality ratio exists between R1 and R2. The values of R1 and R2 are preferably chosen, moreover, in such a way that the total resistance R1+R2 of the voltage-divider bridge is sufficiently high to limit the static current consumption in the bridge to a few hundreds of nano-amperes (nA) at most.

The determining of the values of the components constituting the circuit 40 can therefore be carried out in the following way:

a) the value of the loop capacitance Cc is determined, on the basis of the desired value of the dominant pole p1 at the output S1 of the first stage 10, of the load resistance Rout1 of the first stage 10 and of the gain Av2 of the second stage 20, by using relationship (1) above. This is carried out in the same way as for a circuit according to the prior art such as the circuit 30 represented in FIG. 1;

b) next, values of R1, R2, Cc1 and Cc2 are determined which satisfy relationships (6) and (8) above, and which, moreover, make it possible to obtain the desired limitation of the static current in the voltage-divider bridge R1, R2.

Hence, in an example wherein the power-supply voltage Vcc is equal to +15 V, and wherein, at stage a) above, it is determined that the loop capacitance Cc must be equal to 2 pF (picofarads), the following values may be chosen at stage b):

Cc1=6 pF;

Cc2=3 pF;

R1=10 MΩ (megohms); and,

R2=20 MΩ.

With the values of R1 and R2 above, the total resistance of the divider bridge R1+R2 is equal to 30 MΩ. The maximum current in the voltage-divider bridge, which is given by Vcc/(R1+R2), is then equal to 500 nA. This value is relatively low, and in any event acceptable in the majority of applications.

It will be noted that the value of the poles p2 and p3 and of the zero z1 at the output S1 of the first stage 10, which are given respectively by relationships (2) to (4) above, are not altered by the substitution of a circuit 40 according to the depicted embodiment of the invention for the circuit 30 according to the prior art.

FIG. 3, in which the same elements as in FIGS. 1 and 2 bear the same references, is the diagram of an example of application of a pole-splitting circuit according to the depicted embodiment of the invention, in a defined electronic circuit 100. The latter is, for example, a monolithic integrated circuit, produced according to the HF7CMOS technology. It comprises a first stage 10 which here consists of an operational amplifier, a second stage 20 which here consists of a power-output amplifier, and a pole-splitting circuit 40 the structure and the functioning of which have been described in detail above, in connection with the diagram of FIG. 2.

The capacitors Cc1 and Cc2 of the circuit 40 are capacitors known as "poly 1/poly 2" capacitors. The resistors R1 and R2 of the voltage-divider bridge of the circuit 40 are formed by the P-type MOS transistors mounted as diodes. In one example, these take the form of MOS transistors with long channels in order to obtain a high resistance value (10 MΩ in the example). It is recalled that, indeed, the conduction resistance of an MOS transistor is inversely proportional to the ratio W/L, where W and L are respectively the width and the length of the channel of the transistor. This embodiment is advantageous since a long-channel MOS transistor takes up less space on the silicon substrate than an integrated resistor of 10 MΩ. In the example, R1 consists of a single such transistor, whereas R2 consists of two such transistors in series, all these transistors being identical. In this case, R2=2×R1. Stated otherwise, the proportionality ratio of the resistors R1 and R2 with the total resistance R1+R2 of the divider bridge is equal to one-third and two-thirds, respectively.

Relationship (8) above is then expressed in the form:

$$Cc1=2\times Cc2 \quad (9)$$

which facilitates the determining of the values of Cc1 and Cc2 on the basis of the value of Cc and of relationships (6) and (9).

The fact that the transistors mounted as diodes, which constitute the voltage-divider bridge, are all identical further facilitates the production on silicon.

When, as is the case for an operational amplifier as represented in FIG. 3, the first stage 10 of the electronic circuit features a differential structure, it may be necessary to provide supplementary measures. This is because, with the voltage-divider bridge R1, R2 being linked to the output S1 of this stage, it applies an offset voltage onto this output. This offset voltage creates an imbalance between the outputs of the differential pair of the operational amplifier 10, one of which corresponds to the output S1 of the operational amplifier 10 and the other of which is a node S1' which is not used as an output in this example. In order to compensate for the offset voltage on the output S1', the electronic circuit may comprise a compensation impedance R3 linked to the node S1' in such a way that this node, in static mode, exhibits a potential substantially equal to the static potential of the output S1 of the stage 10. This impedance R3 is, for example, a resistor which is linked between the power-supply terminal Vcc and the node S1', and which exhibits a value substantially equal to the total resistance value R1+R2 of the voltage-divider bridge R1, R2 of the circuit 40.

In the embodiment example of FIG. 3, the compensation impedance R3 advantageously consists of three MOS transistors connected as diodes and mounted in series, which are identical to those constituting the divider bridge R1, R2.

The embodiments of the invention have been described above in a non-limiting application example. It will be noted that it applies to any type of electronic circuit, integrated or otherwise, whatever the technology used (CMOS, bi-CMOS, bipolar, etc.). Furthermore, the first stage is not necessarily an amplifier, and the first and the second stage are not necessarily linked in series with one another, since there may be another stage between the two of them.

I claim:

1. A circuit for splitting poles between a first stage and an inverting voltage-amplifier second stage of an electronic circuit, comprising:

connected between an output of the first stage and an output of the second stage, and in order, a first capacitor, a second capacitor and a resistor; and a voltage-divider bridge connected between a terminal delivering a substantially constant voltage and the output of the first stage, the voltage-divider bridge having an output that is linked to a common node between the first capacitor and the second capacitor, in such a way that a first resistor of the voltage-divider bridge is connected in parallel with the first capacitor.

2. The circuit according to claim 1, wherein, where Cc1 and Cc2 are values of the first capacitor and of second capacitor, respectively, and where R1 and R2 are values of the first resistor and of a second resistor respectively constituting the voltage-divider bridge, the following relationship is satisfied:

$$R2\times(Cc1+Cc2)=(R1+R2)\times Cc1 \quad (8).$$

3. The circuit according to claim 1 wherein a total resistance value of the voltage-divider bridge is sufficiently high to limit the current consumption in the voltage-divider bridge to a maximum of a few hundreds of nano-amperes.

4. An electronic circuit comprising a first stage and a second inverting voltage-amplifier stage having respective outputs that are linked by a circuit for splitting poles, the circuit for splitting poles comprising:

connected between an output of the first stage and an output of the second stage, and in order, a first capacitor, a second capacitor and a resistor; and a voltage-divider bridge connected between a terminal delivering a substantially constant voltage and the output of the first stage, the voltage-divider bridge having an output that is linked to a common node between the first capacitor and the second capacitor, in such a way that a first resistor of the voltage-divider bridge is connected in parallel with the first capacitor.

5. The electronic circuit according to claim 4 wherein, where Cc1 and Cc2 are values of the first capacitor and of second capacitor respectively, and where R1 and R2 are values of the first resistor and of a second resistor respectively constituting the voltage-divider bridge, the following relationship is satisfied:

$$R2 \times (Cc1+Cc2) = (R1+R2) \times Cc1 \qquad (8).$$

6. The electronic circuit according to claim 4 wherein total resistance value of the voltage-divider bridge is sufficiently high to limit current consumption in the voltage-divider bridge to a maximum of a few hundreds of nano-amperes.

7. The electronic circuit according to claim 4, wherein the first stage, the second stage, and the circuit for splitting poles are part of an HF7CMOS monolithic integrated circuit, and further comprising a power-supply terminal delivering a power-supply voltage higher than 10 volts.

8. The electronic circuit according to claim 4, wherein the terminal of the circuit for splitting poles delivering a substantially constant voltage, is a power-supply terminal of the electronic circuit.

9. The electronic circuit according to claim 8 wherein the power-supply terminal delivers a power-supply voltage higher than 10 volts.

10. The electronic circuit according to claim 4 wherein the voltage-divider bridge consists of a first resistor and of a second resistor in series, and wherein at least one of said first and second resistor is formed by at least one long-channel MOS transistor connected as a diode.

11. The electronic circuit according to claim 4 wherein the voltage-divider bridge consists of a first resistor and of a second resistor in series, and wherein both of said first and second resistor are formed by at least one long-channel MOS transistor connected as a diode.

12. The electronic circuit according to claim 4 wherein total resistance of the voltage-divider bridge is substantially equal to 30 megohms, for a power-supply voltage substantially equal to 15 volts.

13. The electronic circuit according to claim 4 wherein, the first stage having a differential structure, the electronic circuit further comprises a compensation impedance linked to a defined node of the first stage whereby this node exhibits a static potential substantially equal to the static potential of the output of the first stage.

14. The electronic circuit according to claim 13 wherein the compensation impedance is arranged between said terminal of the circuit for splitting poles which delivers a substantially constant voltage on the one hand, and said defined node of the first stage on the other hand, and wherein the compensation impedance exhibits a resistance value which is substantially equal to the total resistance value of the voltage-divider bridge of the circuit for splitting poles.

15. The electronic circuit according to claim 4 wherein the circuit for splitting poles in indirectly linked to the first stage.

16. The electronic circuit according to claim 4 wherein the circuit for splitting poles in indirectly linked to the second stage.

17. An electronic system comprising
   a first stage having a first output;
   a second inverting voltage-amplifier stage having a second output; and
   a circuit for splitting poles linking the first and second outputs, the circuit for splitting poles comprising:
      a first resistor having a first terminal connected to the first ouput of the first stage and a second terminal linked to a constant voltage supply;
      a first capacitor having a first terminal connected to the first terminal of the first resistor and a second terminal connected to the second terminal of the first resistor; and
      a second capacitor having a first terminal connected to the second terminal of the first capacitor and a second terminal being linked to the second output of the second stage.

18. The electronic system of claim 17, further comprising a second resistor having a first terminal connected to the second terminal of the first resistor and a second terminal connected to the constant voltage supply.

19. The electronic system of claim 17, further comprising a third resistor having a first terminal connected to the second terminal of the second capacitor and a second terminal connected to the second output of the second stage.

* * * * *